United States Patent
Yang

(10) Patent No.: US 10,256,722 B1
(45) Date of Patent: Apr. 9, 2019

(54) OSCILLATOR AND ASSOCIATED DIRECT CURRENT-TO-DIRECT CURRENT CONVERTER APPLYING THE OSCILLATOR

(71) Applicant: Elite Semiconductor Memory Technology Inc., Hsinchu (TW)

(72) Inventor: Yao-Wei Yang, Changhua County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 15/806,337

(22) Filed: Nov. 8, 2017

(51) Int. Cl.
*H02M 3/156* (2006.01)
*H03K 7/06* (2006.01)
*H03K 3/36* (2006.01)

(52) U.S. Cl.
CPC .............. *H02M 3/156* (2013.01); *H03K 3/36* (2013.01); *H03K 7/06* (2013.01)

(58) Field of Classification Search
CPC ............ H02M 3/156; H03K 3/36; H03K 7/06
USPC .............. 363/21.15, 56.12, 49, 21.18, 21.17; 323/282
See application file for complete search history.

(56) References Cited

U.S. PATENT DOCUMENTS

| | | | | |
|---|---|---|---|---|
| 7,423,494 B1* | 9/2008 | Xin-LeBlanc | ........... | H03K 3/84 331/78 |
| 7,701,190 B2* | 4/2010 | Chen | ................... | H02M 3/1584 323/283 |
| 8,270,185 B2* | 9/2012 | Hu | ..................... | H02M 3/33507 363/21.05 |
| 8,289,733 B2* | 10/2012 | Gong | ................ | H02M 3/33507 363/21.11 |
| 10,003,271 B2* | 6/2018 | Fang | ................. | H02M 3/33523 |
| 2005/0024898 A1* | 2/2005 | Yang | ................. | H02M 3/33507 363/21.12 |
| 2005/0253636 A1* | 11/2005 | Yang | ................. | H02M 3/33507 327/172 |
| 2007/0280314 A1* | 12/2007 | Keh | ..................... | H01S 5/06808 372/38.02 |
| 2007/0290960 A1* | 12/2007 | Heo | ....................... | H01S 3/1305 345/82 |

(Continued)

OTHER PUBLICATIONS

Received STIC search report from EIC 2800 searcher Samir Patel on Apr. 9, 2018 for claim 1.*

(Continued)

*Primary Examiner* — Nguyen Tran
*Assistant Examiner* — Htet Z Kyaw
(74) *Attorney, Agent, or Firm* — Winston Hsu

(57) ABSTRACT

An oscillator includes a reference current generating circuit, a modulator circuit, and an oscillating circuit. The reference current generating circuit generates a first reference current. The modulator circuit generates a modulation current according to the first reference current and a feedback voltage, wherein the modulation current is negatively correlated with the feedback voltage. The oscillating circuit receives at least the modulation current, and generates an oscillating signal with an oscillating frequency according to at least the modulation current, wherein the oscillating frequency is varied according to the modulation current. The oscillator may be employed by a direct current (DC)-to-DC voltage converter.

16 Claims, 4 Drawing Sheets

(56) References Cited

U.S. PATENT DOCUMENTS

| | | | |
|---|---|---|---|
| 2009/0219000 A1* | 9/2009 | Yang | H02M 3/33507 323/282 |
| 2010/0202162 A1* | 8/2010 | Yang | H02M 3/33523 363/21.02 |
| 2011/0199145 A1* | 8/2011 | Kawai | H02M 3/156 327/419 |
| 2012/0105030 A1* | 5/2012 | Chen | H02M 3/156 323/271 |
| 2012/0194227 A1* | 8/2012 | Lin | H02M 1/44 327/113 |
| 2014/0153598 A1* | 6/2014 | Neumann | H01S 5/0427 372/38.01 |
| 2017/0201174 A1* | 7/2017 | Li | H02M 3/157 |
| 2018/0159539 A1* | 6/2018 | Tseng | H03K 21/08 |

OTHER PUBLICATIONS

Received STIC search report from EIC 2800 searcher Samir Patel on Apr. 11, 2018 for claim 11.*
Received STIC search report from EIC 2800 searcher Mesfin Getaneh on Feb. 7, 2019. (Year: 2019).*

* cited by examiner

OSCILLATOR AND ASSOCIATED DIRECT CURRENT-TO-DIRECT CURRENT CONVERTER APPLYING THE OSCILLATOR

BACKGROUND OF THE INVENTION

1. Field of the Invention

The present invention relates to an oscillator and a direct current (DC)-to-DC converter.

2. Description of the Prior Art

Taking current mode as an example, when a buck converter or a boost converter operating in the current mode initially starts, the output voltage is relatively low, and the inductor current accordingly has a large incline slope which makes the current detecting circuit take time to detect said inductor current. Therefore, the inductor current is difficult to be controlled when it operates in the high frequency and has a large slope. To make the sensing and control circuit control the inductor current with accuracy and efficiency, said buck converter or said boost converter suppresses the changes of the inductor current and the output voltage by modulating the frequency of the oscillator. In addition, when a short circuit occurs at an output terminal of a typical direct current (DC)-to-DC converter such as a buck converter, the output terminal will be short-circuited to ground or to the low supply voltage. The resulting gigantic voltage level between the input terminal and the output terminal causes an intense current to pass through the inductor of the DC-to-DC converter, which has great potential to damage the circuit. To relieve the strong inductor current when the voltage level between the output terminal and the input terminal is relatively large, a frequency modulation is desired for the oscillation signal generated by an oscillator of the DC-to-DC converter, wherein through said frequency modulation, the sensing and control circuit can suppress the current. Furthermore, through said frequency modulation which is relative linear, the process from start to steady will be relatively stable compared to frequency hopping.

SUMMARY OF THE INVENTION

One of the objectives of the present invention is therefore to provide an oscillator and an associated DC-to-DC converter to solve the aforementioned problem.

According to an embodiment of the present invention, an oscillator is disclosed, comprising: a reference current generating circuit, a modulator circuit, and an oscillating circuit, wherein the reference current generating circuit is arranged to generate a first reference current; the modulator circuit is coupled to the reference current generating circuit and arranged to generate a modulation current according to the first reference current and a feedback voltage, wherein the modulation current is negatively correlated with the feedback voltage; and the oscillating circuit is coupled to the modulator circuit and arranged to receive at least the modulation current and generate an oscillating signal with an oscillating frequency according to at least the modulation current, wherein the oscillating frequency is varied according to the modulation current.

According to an embodiment of the present invention, a DC-to-DC converter is disclosed, comprising: an inductor-capacitor circuit, a feedback circuit, and an oscillator, wherein the inductor-capacitor circuit comprises at least an inductor and a capacitor, and is arranged to receive an inductor current from an input voltage source of the DC-to-DC converter via at least a switch to provide energy to a following loading; the feedback circuit is coupled to the inductor-capacitor circuit and arranged to generate a feedback voltage according to the inductor current; and the oscillator is coupled to the feedback circuit and arranged to generate the oscillating signal according to the feedback voltage, wherein the switch is controlled according to the oscillating signal. The oscillator comprises: a reference current generating circuit, a modulator circuit, and an oscillating circuit, wherein the reference current generating circuit is arranged to generate a first reference current; the modulator circuit is coupled to the reference current generating circuit and arranged to generate a modulation current according to the first reference current and a feedback voltage, wherein the modulation current is negatively correlated with the feedback voltage; and the oscillating circuit is coupled to the modulator circuit and arranged to receive at least the modulation current and generate an oscillating signal with an oscillating frequency according to at least the modulation current, wherein the oscillating frequency is varied according to the modulation current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
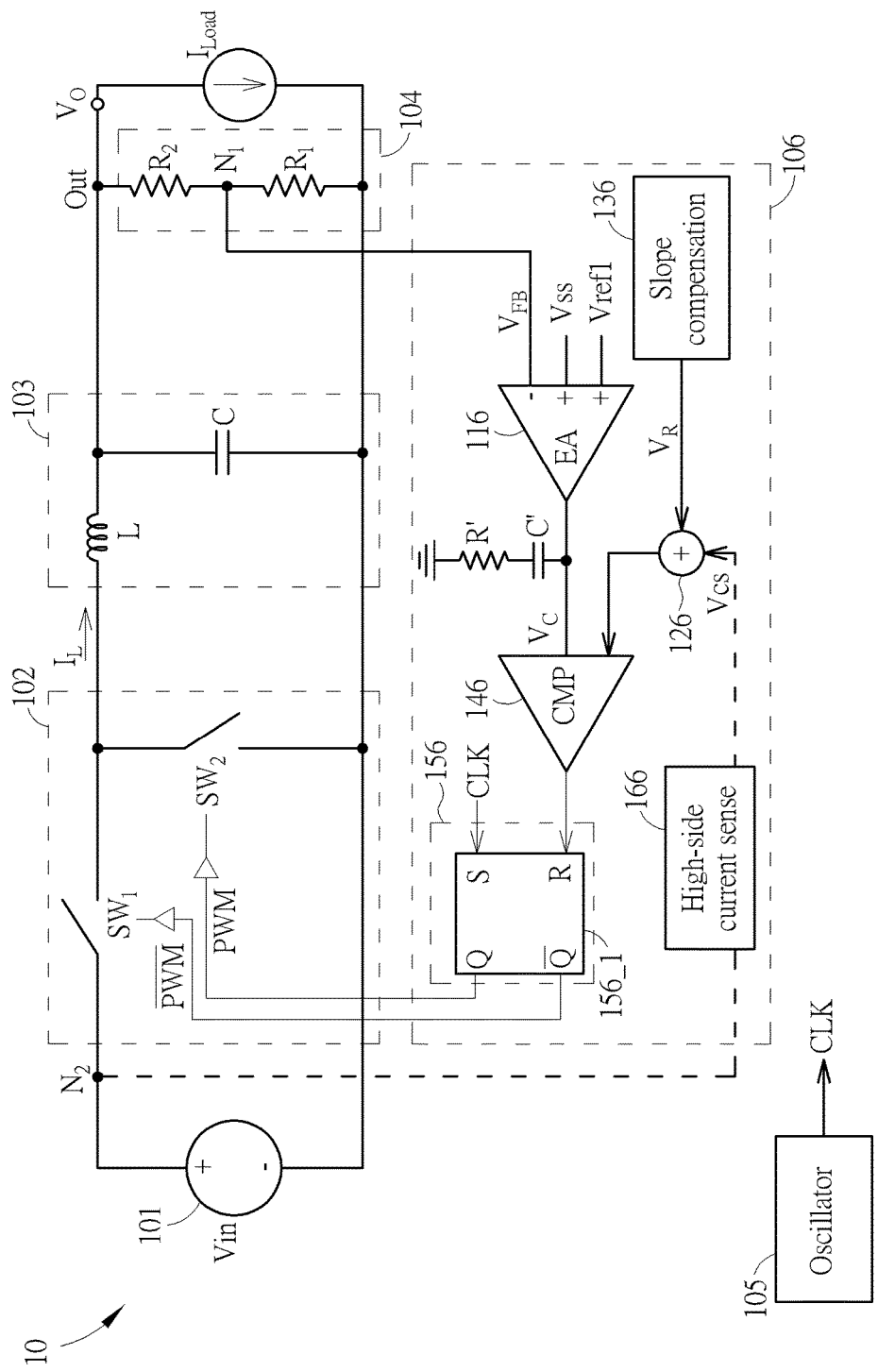
FIG. 1 is a diagram illustrating a buck converter according to the prior art.

As mentioned in the prior art, a frequency modulation is desired for a DC-to-DC converter such as a buck converter or a boost converter. FIG. 1 illustrates a conventional current mode buck converter with a slope compensation mechanism as an example. The current mode buck converter 10 comprises: an input voltage source 101 for providing an input voltage $V_{in}$; a switching circuit 102 comprising switches SW1 and SW2 which are controlled by a pulse width modulation (PWM) signal and an inverted PWM signal, wherein the PWM signal and the inverted PWM signal are generated according to an oscillation signal CLK from an oscillator 105; an inductor-capacitor circuit 103 comprising an inductor L and a capacitor C, wherein the switching circuit 102 stores/releases energy in response to the inductor L of the inductor-capacitor circuit 103 via an inductor current $I_L$, and the released energy is utilized by the following loading via a loading current $I_{load}$ as shown in FIG. 1, a feedback voltage 104 comprising resistors $R_1$ and $R_2$ for generating a feedback voltage $V_{FB}$ at a terminal $N_1$ coupled between the resistors $R_1$ and $R_2$ according to the inductor current $I_L$, wherein when the loading current $I_{load}$ has a dramatic variation, the current mode buck converter 10 is not able to stabilize the output voltage $V_O$ immediately which results in the variation on the feedback voltage $V_{FB}$ thereby. The current mode buck converter 10 further comprises a typical peak current mode controller 106. The typical peak current mode controller 106 comprises an error amplifier 116 including a negative input terminal for receiving the feedback voltage $V_{FB}$ and two positive input terminals for receiving a soft-start voltage $V_{ss}$ and a reference voltage $V_{ref1}$ to generate an output voltage $V_C$ on an output terminal of the error amplifier 116; an adder 126 for receiving a current sensing voltage $V_{cs}$ generated by sensing the current on a terminal $N_2$ through a high-side current sense circuit 166 and a ramp voltage $V_R$ generated from a slope compensation circuit 136; a comparator 146 for generating a compared signal at an output of the comparator 146; a control logic circuit 156 comprising a SR latch 156_1, wherein the SR latch 156_1 receives the oscillation signal CLK generated from the oscillator 105 and the compared signal generated from the comparator 146 for generating the PWN signal and the inverted PWM signal on an output terminal Q and an inverted output terminal $\overline{Q}$ of the SR latch 156_1 respectively, and the PWN signal and the inverted PWM signal are sent to the switching circuit 102 as shown in FIG. 1; and a resistor R' and a capacitor C' connected in series at the output terminal of the error amplifier 116, wherein the resistor R' and the capacitor C' constitute a compensation circuit. However, the compensation circuit is not limited to be implemented by the resistor R' and the capacitor C'. Those skilled in the art must understand the compensation circuit can be implemented by different architecture. The current mode buck converter 10 with the slope compensation mechanism should be well-known to those skilled in the art.

This invention focuses on the oscillator 105 having the ability of frequency modulation to solve the problem mentioned in the prior art. Please note that the oscillator 105 disclosed by the present invention is not limited to be applied to a buck converter as depicted in FIG. 1. In other embodiments, the oscillator 105 can alternatively be applied to a boost converter.

Figure 2:
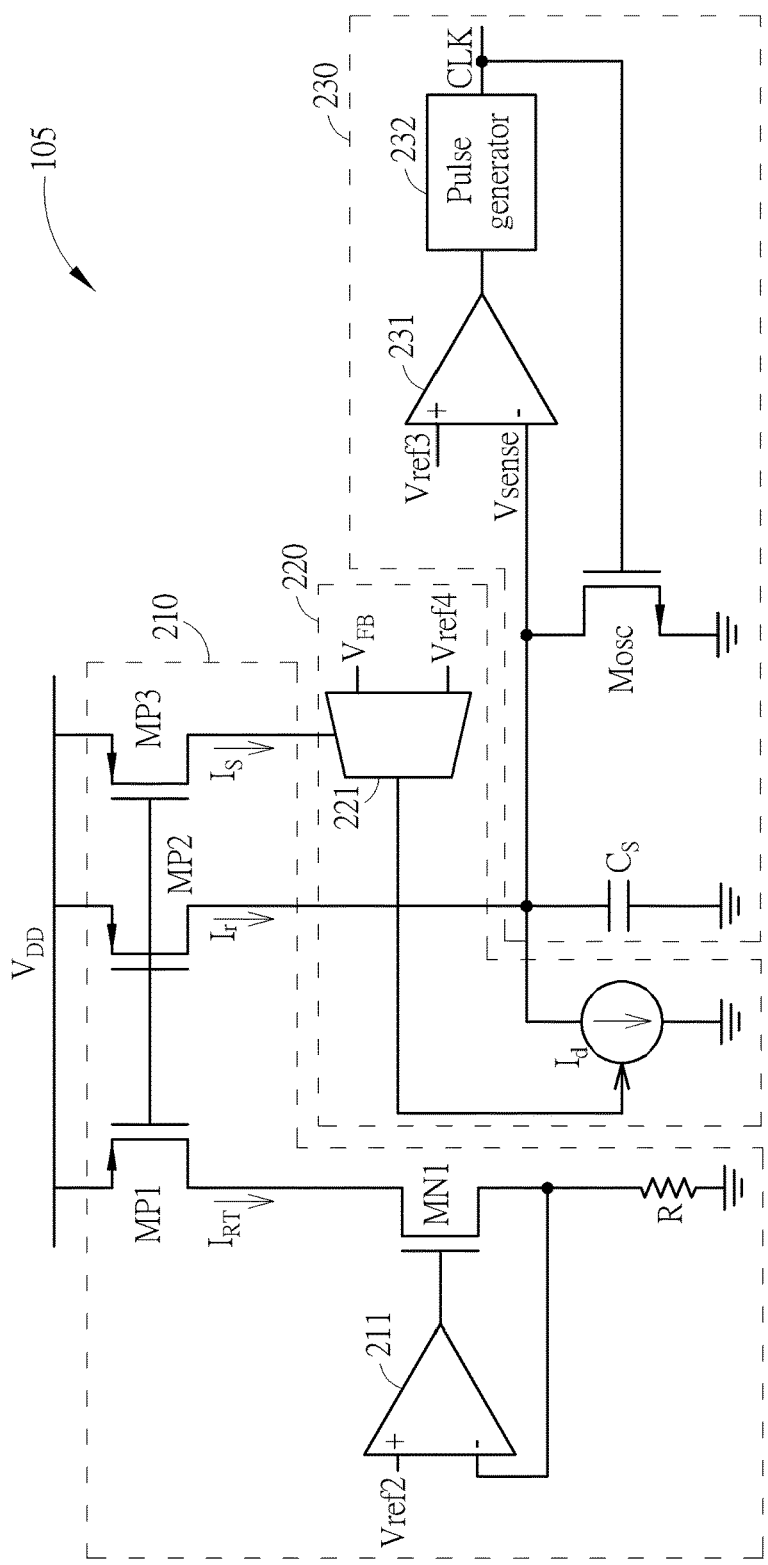
FIG. 2 is a diagram illustrating an oscillator according to an embodiment of the present invention.

FIG. 2 is a diagram illustrating an oscillator 105 according to an embodiment of the present invention. The oscillator 105 comprises a reference current generating circuit 210, a modulator circuit 220 and an oscillating circuit 230. The reference current generating circuit 210 comprises transistors MN1, MP1, MP2 and MP3, a resistor R and an amplifier 211. As shown in FIG. 2, the transistors MP1 and MP3 constitute a first current mirror for generating a reference current $I_s$ according to a current $I_{RT}$, and the transistor MP1 and MP2 constitute a second current mirror for generating a reference current $I_r$ according to the current $I_{RT}$. The current $I_{RT}$ is generated from an operational transconductance amplifier (OTA), wherein the OTA is composed of the amplifier 211, the transistor MN1 and the resistor R, and the operation and the characteristic of the OTA should be well known to those skilled in the art; the details are therefore omitted here for brevity. Please note that, for modulation purposes, the magnitude of the reference current $I_s$ is configured to be smaller than that of the reference current $I_r$, which means the width of the transistor MP3 over a length of the transistor MP3 is configured to be smaller than that of the transistor MP2 according to the characteristic of current mirrors, i.e. $(W_{MP3}/L_{MP3})<(W_{MP2}/L_{MP2})$. The modulator circuit 220 is arranged to generate a modulation current $I_d$ according to the reference current $I_s$ and the feedback voltage $V_{FB}$ from the feedback circuit 104 of the current mode buck converter 10. More specifically, the modulator circuit 220 comprises a comparator 221 driven by the reference current $I_s$ for comparing the feedback voltage $V_{FB}$ with the reference voltage $V_{ref4}$ to generate the modulation current $I_d$.

The detailed operation and architecture of the modulator circuit 220 will be discussed later. The oscillating circuit 230 comprises an oscillating capacitor $C_s$, a transistor $M_{osc}$, a comparing circuit 231, and a pulse generator circuit 232. As shown in FIG. 2, a terminal of the capacitor $C_s$ is coupled to the reference current $I_r$, the modulation current $I_d$, a drain terminal of the transistor $M_{osc}$ and an input terminal of the comparing circuit 231 while the other terminal of the capacitor $C_s$ is coupled to a reference voltage (e.g. ground voltage), wherein the capacitor receives the reference current $I_r$ and the modulation current $I_d$ to generate a voltage $V_{sense}$ at the input terminal of the comparing circuit 231. The other input terminal of the comparing circuit 231 is coupled to the reference voltage $V_{ref3}$, and the comparing circuit 231 compares the reference voltage $V_{ref3}$ with the voltage $V_{sense}$ and outputs the result to the pulse generator circuit 232. The pulse generator circuit 232 generates the oscillating signal CLK according to the output of the comparing circuit 231. The architecture of the oscillating circuit 230 should be well known to those skilled in the art. As the present invention focuses on the frequency modulation, the detailed operation of the oscillating circuit 230 is omitted here. In this embodiment, the transistors MP1, MP2 and MP3 are implemented by P-type metal oxide semiconductor field effect transistors (MOSFET) while the transistor MN1 is implemented by an N-type MOSFET.

Figure 3:
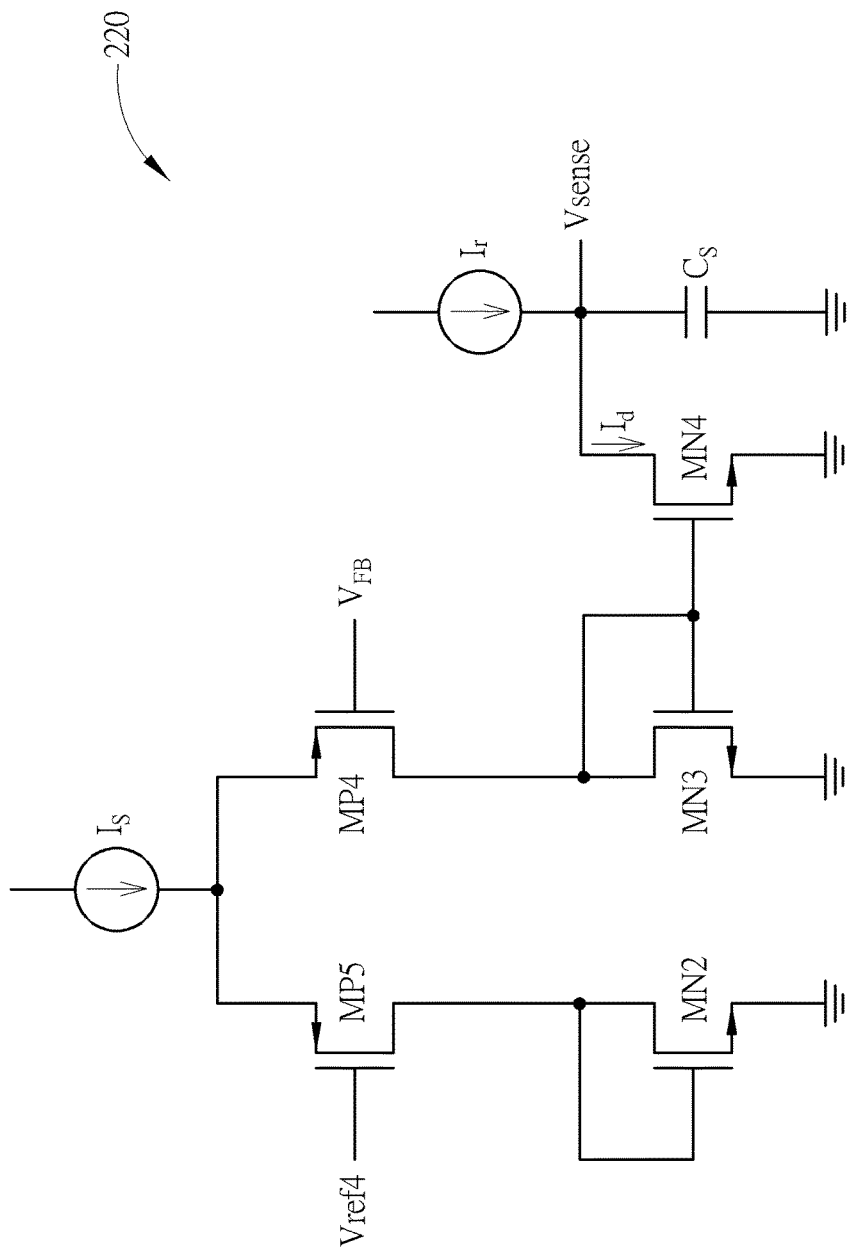
FIG. 3 is a diagram illustrating a modulator circuit of the oscillator according to an embodiment of the present invention.

FIG. 3 is a diagram illustrating a modulator circuit 220 of the oscillator 105 according to an embodiment of the present invention. The modulator circuit 220 comprises transistors MP4, MP5, MN2, MN3 and MN4, wherein the transistors MN3 and MN4 constitute a third current mirror. As shown in FIG. 3, a gate terminal of the transistor MP4 is coupled to the feedback voltage $V_{FB}$ of the current mode buck converter 10, a drain terminal of the transistor MP4 is coupled to a drain terminal of the transistor MN3, and a source terminal of the transistor MP4 is coupled to the reference current $I_s$. Further, a gate terminal of the transistor MP5 is coupled to a reference voltage $V_{ref4}$, a drain terminal of the transistor MP5 is coupled to a drain terminal of the transistor MN2 (which is configured to be a resistor by connecting a gate terminal with the drain terminal), and a source terminal of the transistor MP5 is coupled to the reference current $I_s$. In other embodiments, the transistor MN2 can be implemented by a real resistor; this is not a limitation of the present invention. Finally, the transistor MN4 is coupled to the oscillating capacitor $C_S$ in parallel. In this embodiment, the transistors MP4 and MP5 are implemented by P-type MOSFETs while the transistors MN2-MN4 are implemented by N-type MOSFETs. As mentioned above, the frequency modulation is desired when the voltage level between the input voltage $V_{in}$ and the output voltage $V_{out}$ is relatively large, and in the buck converter, the frequency modulation is needed when the output voltage $V_{out}$ is too small, which means the feedback voltage $V_{FB}$ is relatively small. The modulator circuit 220 compares the feedback voltage $V_{FB}$ to the reference voltage $V_{ref4}$ to adjust the current received by the oscillating capacitor $C_S$. More specifically, when the feedback voltage $V_{FB}$ is smaller than the reference voltage $V_{ref4}$, the transistor MP4 draws more current from the reference current $I_S$ than the transistor MP5, and according to the characteristic of the current mirror, a drain terminal of the transistor MN4 draws the modulation current $I_d$ from the reference current $I_r$ out of the oscillating capacitor $C_S$. In this way, the current received by the oscillating capacitor $C_s$ is smaller, and thereby controls an oscillating frequency of the oscillating signal CLK to be slower. When the feedback voltage $V_{FB}$ becomes bigger, less modulation current $I_d$ is drawn by the transistor MN4, which means the oscillating frequency of the oscillating signal CLK becomes faster.

Figure 4:
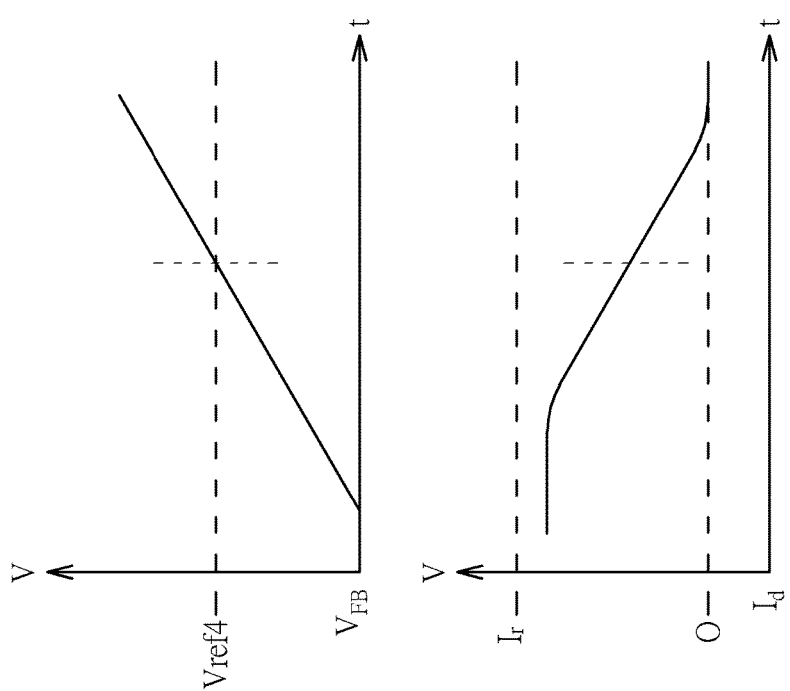
FIG. 4 is a diagram illustrating a feedback voltage and a modulation current according to an embodiment of the present invention.

FIG. 4 is a diagram illustrating the feedback voltage $V_{FB}$ and the modulation current $I_d$ according to an embodiment of the present invention. As shown in FIG. 4, when the feedback voltage $V_{FB}$ is close to 0V, the modulation current $I_d$ is relatively large to relieve the oscillating frequency of the oscillating signal CLK. When the feedback voltage $V_{FB}$ gradually increases, the modulation current $I_d$ gradually decreases to speed up the oscillating frequency of the oscillating signal CLK. In this way, the problem mentioned in the prior art can be effectively solved. It should be noted that the abovementioned embodiments are illustrated on the basis of the buck converter; however, the concept of the modulator circuit 220 can be used for controlling the oscillating frequency of the oscillating signal CLK applied to a boost converter as well. For example, when the output voltage of the current mode boost converter is greater than the input voltage, e.g. $V_{out}=V_{in}\sim XV_{in}$, where X is a value greater than 1, less current is received by the oscillating capacitor to relieve the oscillating frequency of the oscillating signal CLK. In this case, the architecture of the modulator circuit 220 should have a slight adjustment. Those skilled in the art should understand the implementation of the modulator circuit 220 of the oscillator 105 applied to a boost converter. The detailed description is omitted here for brevity.

Briefly summarized, with the modulator circuit 220 disclosed by the present invention, the oscillating frequency of the oscillating signal CLK can be effectively suppressed at low frequencies by adjusting the current received by the oscillating capacitor $C_S$ when the feedback voltage $V_{FB}$ is relatively small.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator, comprising:
a reference current generating circuit, arranged to generate a first reference current;
a modulator circuit, coupled to the reference current generating circuit, wherein the modulator circuit is arranged to generate a modulation current according to the first reference current and a feedback voltage, and the modulation current is negatively correlated with the feedback voltage, the modulator circuit comprising:
a first transistor, having a source terminal coupled to the first reference current, and a gate terminal coupled to the feedback voltage, wherein the first transistor is controlled by the feedback voltage; and
a current mirror, coupled to a drain terminal of the first transistor to generate the modulation current; and
an oscillating circuit, coupled to the modulator circuit, wherein the oscillating circuit is arranged to receive at least the modulation current and generate an oscillating signal with an oscillating frequency according to at least the modulation current, wherein the oscillating frequency is varied according to the modulation current.

2. The oscillator of claim 1, wherein a maximum value of the modulation current equals the first reference current.

3. The oscillator of claim 1, wherein the modulator circuit further comprises:
a second transistor, coupled to the first reference current, wherein the second transistor is controlled by a reference voltage.

4. The oscillator of claim 3, wherein a source terminal of the second transistor is coupled to the first reference current and a gate terminal of the second transistor is coupled to the reference voltage, and the modulator circuit further comprises:
a resistance circuit, coupled to a drain terminal of the second transistor.

5. The oscillator of claim 4, wherein the resistance circuit comprises a third transistor.

6. The oscillator of claim 1, wherein the reference current generating circuit comprises:
a current source;
a first current mirror, coupled to the current source and the modulator circuit, wherein the first current mirror is arranged to generate the first reference current; and
a second current mirror, coupled to the current source and the oscillating circuit, wherein the second current mirror is arranged to generate a second reference current to the oscillating circuit, the second reference current being larger than the first reference current, and the oscillating circuit generates the oscillating signal according to the modulation current and the second reference current.

7. The oscillator of claim 6, wherein the first current mirror comprises a first transistor and the second current mirror comprises a second transistor, and a width of the first transistor over a length of the first transistor is smaller than a width of the second transistor over a length of the second transistor.

8. The oscillator of claim 1, wherein the oscillating circuit comprises:
an oscillating capacitor;
a transistor, wherein a drain terminal of the transistor is coupled to one end of the oscillating capacitor, and a gate terminal of the transistor is coupled to the oscillating signal;
a comparing circuit comprising a first input terminal coupled to the drain terminal of the transistor, a second input terminal coupled to a reference voltage, and an output terminal; and
a pulse generator circuit, arranged to generate the oscillating signal according to an output of the output terminal of the comparing circuit.

9. A direct current (DC)-to-DC voltage converter, comprising:
an inductor-capacitor circuit, comprising at least an inductor and a capacitor, wherein the inductor-capacitor circuit is arranged to receive an inductor current from an input voltage source of the DC-to-DC converter via at least a switch to provide energy for a following loading;

a feedback circuit, coupled to the inductor-capacitor circuit, wherein the feedback circuit is arranged to generate a feedback voltage according to the inductor current; and an oscillator, coupled to the feedback circuit, wherein the oscillator is arranged to generate an oscillating signal according to the feedback voltage, and the switch is controlled according to the oscillating signal, and the oscillator comprises:

a reference current generating circuit, arranged to generate a first reference current;

a modulator circuit, coupled to the reference current generating circuit, wherein the modulator circuit is arranged to generate a modulation current according to the first reference current and the feedback voltage generated from the feedback circuit, and the modulation current is negatively correlated with the feedback voltage, the modulator circuit comprising:

a first transistor, having a source terminal coupled to the first reference current, and a gate terminal coupled to the feedback voltage, wherein the first transistor is controlled by the feedback voltage; and a current mirror, coupled to a drain terminal of the first transistor to generate the modulation current; and an oscillating circuit, coupled to the modulator circuit, wherein the oscillating circuit is arranged to receive at least the modulation current and generate the oscillating signal with an oscillating frequency according to at least the modulation current, wherein the oscillating frequency is varied according to the modulation current.

10. The DC-to-DC converter of claim 9, wherein a maximum value of the modulation current equals the reference current.

11. The DC-to-DC converter of claim 9, wherein the modulator circuit further comprises:

a second transistor, coupled to the first reference current, wherein the second transistor is controlled by a reference voltage.

12. The DC-to-DC converter of claim 11, wherein a source terminal of the second transistor is coupled to the first reference current and a gate terminal of the second transistor is coupled to the reference voltage, and the modulator circuit further comprises:

a resistance circuit, coupled to a drain terminal of the second transistor.

13. The DC-to-DC converter of claim 12, wherein the resistance circuit comprises a third transistor.

14. The DC-to-DC converter of claim 9, wherein the reference current generating circuit comprises:

a current source;

a first current mirror, coupled to the current source and the modulator circuit, wherein the first current mirror is arranged to generate the first reference current; and a second current mirror, coupled to the current source and the oscillating circuit, wherein the second current mirror is arranged to generate a second reference current to the oscillating circuit, the second reference current is larger than the first reference current, and the oscillating circuit generates the oscillating signal according to the modulation current and the second reference current.

15. The DC-to-DC converter of claim 14, wherein the first current mirror comprises a first transistor and the second current mirror comprises a second transistor, and the width/length of the first transistor is smaller than the width/length of the second transistor.

16. The DC-to-DC converter of claim 9, wherein the oscillating circuit comprises:

a capacitor;

a transistor, wherein a drain terminal of the transistor is coupled to one end of the capacitor, and a gate terminal of the transistor is coupled to the oscillating signal;

a comparing circuit comprising a first input terminal coupled to the drain terminal of the transistor, a second input terminal coupled to a reference voltage, and an output terminal; and a pulse generator circuit, arranged to generate the oscillating signal according to an output of the output terminal of the comparing circuit.

\* \* \* \* \*